(12) United States Patent
Kuwazawa et al.

(10) Patent No.: US 9,786,616 B2
(45) Date of Patent: Oct. 10, 2017

(54) SEMICONDUCTOR APPARATUS, METHOD FOR MANUFACTURING THE SAME, ELECTRONIC DEVICE, AND MOVING BODY

(71) Applicant: SEIKO EPSON CORPORATION, Tokyo (JP)

(72) Inventors: Kazunobu Kuwazawa, Sakata (JP); Hiroaki Nitta, Sakata (JP); Takehiro Endo, Sakata (JP); Mitsuo Sekisawa, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/231,469

(22) Filed: Aug. 8, 2016

(65) Prior Publication Data

US 2017/0053880 A1 Feb. 23, 2017

(30) Foreign Application Priority Data

Aug. 20, 2015 (JP) ................. 2015-163100

(51) Int. Cl.
  *H01L 23/488* (2006.01)
  *H01L 23/00* (2006.01)
(52) U.S. Cl.
  CPC .............. *H01L 24/04* (2013.01); *H01L 24/03* (2013.01); *H01L 24/05* (2013.01); *H01L 24/06* (2013.01); *H01L 24/07* (2013.01); *H01L 24/08* (2013.01); *H01L 24/09* (2013.01); *H01L 24/11* (2013.01); *H01L 24/12* (2013.01); *H01L 24/13* (2013.01);

(Continued)

(58) Field of Classification Search
  CPC ......... H01L 24/04; H01L 24/05; H01L 24/06; H01L 24/07; H01L 24/08; H01L 24/09; H01L 24/12; H01L 24/13; H01L 24/14; H01L 24/15; H01L 24/16; H01L 24/17; H01L 24/47; H01L 24/48; H01L 24/49; H01L 2224/0401; H01L 2224/04042; H01L 2224/05555
  See application file for complete search history.

(56) References Cited

U.S. PATENT DOCUMENTS

2014/0291838 A1* 10/2014 Chen .................... H01L 23/485
                                                                257/737
2014/0299990 A1   10/2014 Kageyama et al.
2014/0345928 A1   11/2014 Koyama

FOREIGN PATENT DOCUMENTS

JP    H04-74858 B2    11/1992
JP    2012-146720 A    8/2012
(Continued)

*Primary Examiner* — Fei Fei Yeung Lopez
(74) *Attorney, Agent, or Firm* — Oliff PLC

(57) ABSTRACT

A semiconductor apparatus includes elements formed on a substrate, a first insulation layer, a first pad and a second pad arranged on the first insulation layer and located above the elements, and a second insulation layer that is arranged on the side surfaces and upper surfaces of the first pad and the second pad. The second insulation layer includes openings at upper surfaces of the first pad and the second pad. The thickness of the first pad and the second pad is 2 μm or more, the thickness of the second insulation layer is less than or equal to ⅔ of the thickness of the first pad and the second pad, and the distance between the first pad and the second pad is greater than or equal to four times the thickness of the first pad and the second pad.

13 Claims, 4 Drawing Sheets

(52) U.S. Cl.
CPC .............. *H01L 24/14* (2013.01); *H01L 24/15* (2013.01); *H01L 24/16* (2013.01); *H01L 24/17* (2013.01); *H01L 24/43* (2013.01); *H01L 24/47* (2013.01); *H01L 24/48* (2013.01); *H01L 24/49* (2013.01); *H01L 2224/0401* (2013.01); *H01L 2224/04042* (2013.01); *H01L 2224/05555* (2013.01); *H01L 2224/05556* (2013.01); *H01L 2224/05557* (2013.01); *H01L 2224/05624* (2013.01); *H01L 2224/48463* (2013.01)

(56) References Cited

FOREIGN PATENT DOCUMENTS

| | | | |
|---|---|---|---|
| JP | 2013-229634 | A | 11/2013 |
| JP | 2014-203958 | A | 10/2014 |
| JP | 2015-008272 | A | 1/2015 |

\* cited by examiner

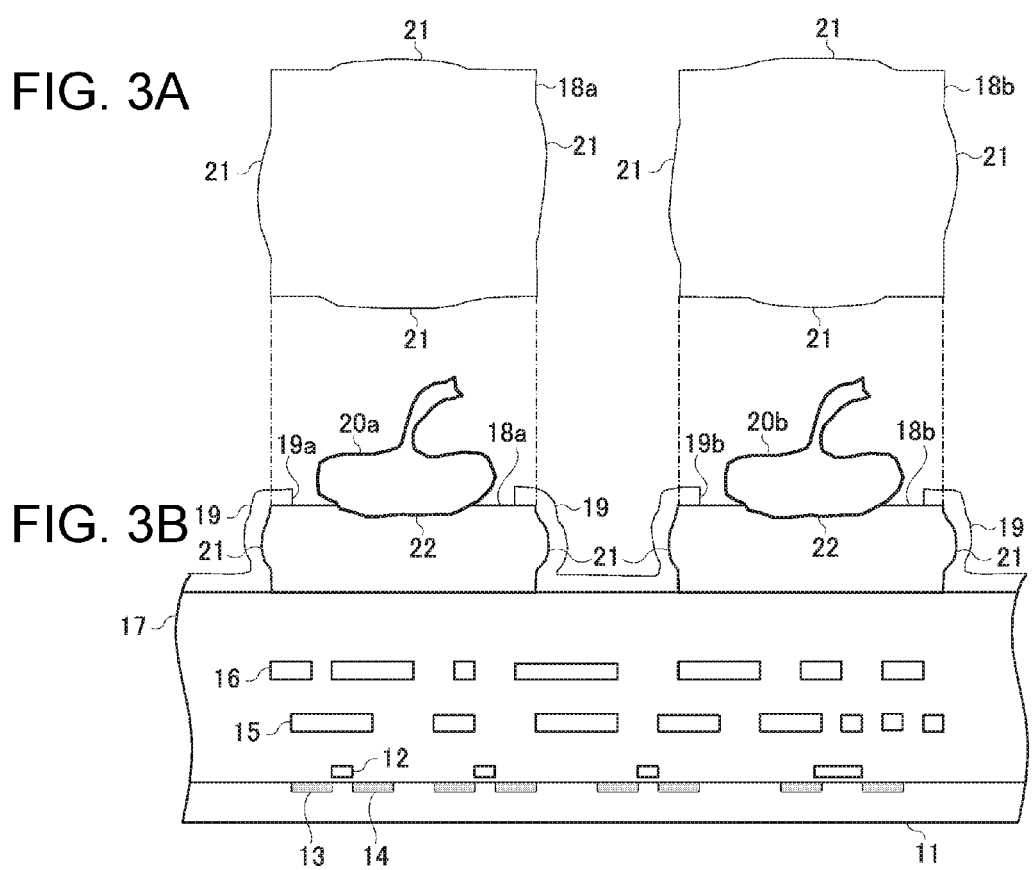

SEMICONDUCTOR APPARATUS, METHOD FOR MANUFACTURING THE SAME, ELECTRONIC DEVICE, AND MOVING BODY

BACKGROUND

1. Technical Field

The present invention relates to a semiconductor apparatus and a method for manufacturing the same. Furthermore, the present invention relates to electronic devices, moving bodies, and the like that include such a semiconductor apparatus.

2. Related Art

Known semiconductor apparatuses include an element region formed on a semiconductor substrate, a pad arranged directly above the element region, and a bump formed on the pad (see JP-B-4-74858).

However, when mounting the semiconductor apparatus to a mounting substrate by joining the bump of the aforementioned conventional semiconductor apparatus to an electrode on the mounting substrate, stress is applied to the pad, and there are cases where an element directly below the pad breaks under the stress.

Also, if a pad is formed above an element, when a bonding wire is joined to the pad or when a probe needle comes into contact with the pad in an inspection step, stress is applied to the pad, and there are cases where an element directly below the pad breaks under the stress.

JP-B-4-74858 (FIG. 4) is an example of related art.

SUMMARY

Several aspects of the invention relate to a semiconductor apparatus that can prevent an element from breaking even if a pad is formed above the element, and a method for manufacturing the same.

Also, several aspects of the invention relate to the provision of an electronic device, a moving body, and the like that include such a semiconductor apparatus.

A first aspect of the present invention is a semiconductor apparatus including: a substrate; an element arranged on the substrate; a first insulation layer arranged on the element and the substrate; a first pad arranged on the first insulation layer and located above the element; a second pad arranged on the first insulation layer; and a second insulation layer arranged on the first insulation layer, on a side surface and an upper surface of the first pad, and on a side surface and an upper surface of the second pad; whereby the second insulation layer includes an opening located at the upper surface of the first pad and an opening located at the upper surface of the second pad, the first pad and the second pad each have a thickness of 2 μm or more, the second insulation layer has a thickness that is less than or equal to $2/5$ of the thickness of the first pad and the second pad, and a distance between the first pad and the second pad is greater than or equal to four times the thickness of the first pad and the second pad.

According to the first aspect of the invention, the thickness of the first pad and the second pad is made to be 2 μm or more, and the thickness of the second insulation layer is made to be less than or equal to $2/5$ of the thickness of the first pad and the second pad. Accordingly, an element can be prevented from breaking even if a pad is formed above the element.

Also, in the first aspect of the invention, bonding wires or bumps are each joined to the first pad and the second pad, the first pad may have a projection on a side surface thereof, and the second pad may have a projection on a side surface thereof. Accordingly, an element can be prevented from breaking even if a pad is formed above the element.

Also, in the first aspect of the invention, portions of the second insulation layer located on the side surfaces of the first pad and the second pad may have a crack or a split portion. Accordingly, an element can be prevented from breaking even if a pad is formed above the element.

Also, in the first aspect of the invention, a planar shape of the first pad and the second pad may be a polygonal shape or a circular shape. Accordingly, the first pad and the second pad can more readily absorb an impact, and an element can be prevented from breaking even if a pad is formed above the element.

Also, in the first aspect of the invention, a material of the first pad and the second pad may be Al or an Al alloy. Accordingly, the first pad and the second pad can more readily absorb an impact, and an element can be prevented from breaking even if a pad is formed above the element.

Also, in the first aspect of the invention, a thickness of portions of the second insulation layer located on the side surfaces of the first pad and the second pad may be less than or equal to $4/5$ of a thickness of portions of the second insulation layer located on the upper surfaces of the first pad and the second pad. Accordingly, the second insulation layer located at the side surfaces of the first pad and the second pad can more readily absorb an impact, and an element can be prevented from breaking even if a pad is formed above the element.

A second aspect of the invention is an electronic device comprising the semiconductor apparatus described in the first aspect of the invention.

A third aspect of the invention is a moving body comprising the the semiconductor apparatus described in the first aspect of the invention.

A fourth aspect of the invention is a method for manufacturing a semiconductor apparatus, comprising: (a) forming an element on a substrate; (b) forming a first insulation layer on the element and the substrate; (c) forming a first pad on the first insulation layer so as to be located above the element, and forming a second pad on the first insulation layer; (d) forming a second insulation layer on the first insulation layer, the first pad, and the second pad; and (e) forming an opening at an upper surface of the first pad and at an upper surface of the second pad, whereby, in the step (c), the first pad and the second pad are each formed so as to have a thickness of 2 μm or more, and such that a distance between the first pad and the second pad is greater than or equal to four times the thickness of the first pad and the second pad, and in the step (d), the second insulation layer is formed so as to have a thickness that is less than or equal to $2/5$ of the thickness of the first pad and the second pad.

According to the fourth aspect of the invention, the thickness of the first pad and the second pad is made to be 2 μm or more, and the thickness of the second insulation layer is made to be less than or equal to $2/5$ of the thickness of the first pad and the second pad. Accordingly, an element can be prevented from breaking even if a pad is formed above the element.

Also, in the fourth aspect of the invention, after the step (e), a depression may be formed in the upper surfaces of the first pad and the second pad and a projection may be formed on side surfaces of the first pad and the second pad by joining bonding wires to the first pad and the second pad respectively. Accordingly, an impact that occurs when joining the bonding wires can be absorbed by the first pad and the second pad, and an element can be prevented from breaking even if a pad is formed above the element.

Also, in the fourth aspect of the invention, after the step (e), (f) forming a first bump on the first pad and forming a second bump on the second pad, and (g) mounting a semiconductor apparatus on a mounting substrate by joining the first bump to a first electrode on the mounting substrate and joining the second bump to a second electrode on the mounting substrate, whereby in the step (g), when the semiconductor apparatus is mounted to the mounting substrate, a depression may be formed in the upper surfaces of the first pad and the second pad, and a projection may be formed on side surfaces of the first pad and the second pad. Accordingly, an impact that occurs at the time of mounting can be absorbed by the first pad and the second pad, and an element can be prevented from breaking even if a pad is formed above the element.

Also, in the fourth aspect of the invention, when the projection is formed on the side surfaces of the first pad and the second pad, a crack or a split portion may be formed in portions of the second insulation layer located on the side surfaces of the first pad and the second pad. Accordingly, an element can be prevented from breaking even if a pad is formed above the element.

BRIEF DESCRIPTION OF THE DRAWINGS

In FIG. 3, (A) is a plan view showing pads to which bonding wires have been joined, and (B) is a cross-sectional view showing the semiconductor apparatus after the bonding wires have been joined to the pads.

DESCRIPTION OF EXEMPLARY EMBODIMENTS

Hereinafter, embodiments of the invention will be described in detail with reference to the drawings. However, the invention is not limited to the following description, and it can be easily understood by a person skilled in the art that various changes may be made to the mode and the details of the invention without departing from the spirit and scope of the invention. Therefore, the invention is not to be construed as being limited to the following description of the embodiments. Note that the same reference signs are given to the same constituent elements, and redundant description is omitted.

Figure 1A:
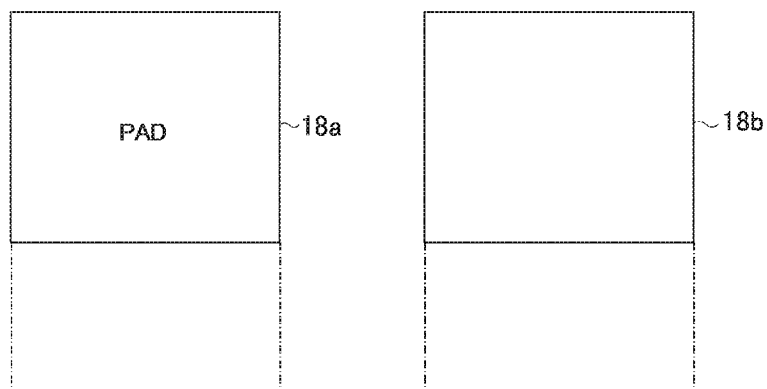
In FIG. 1, (A) is a plan view showing pads of a semiconductor apparatus according to an embodiment of the invention, and (B) is a cross-sectional view of the semiconductor apparatus according to the embodiment of the invention.
Figure 1B:
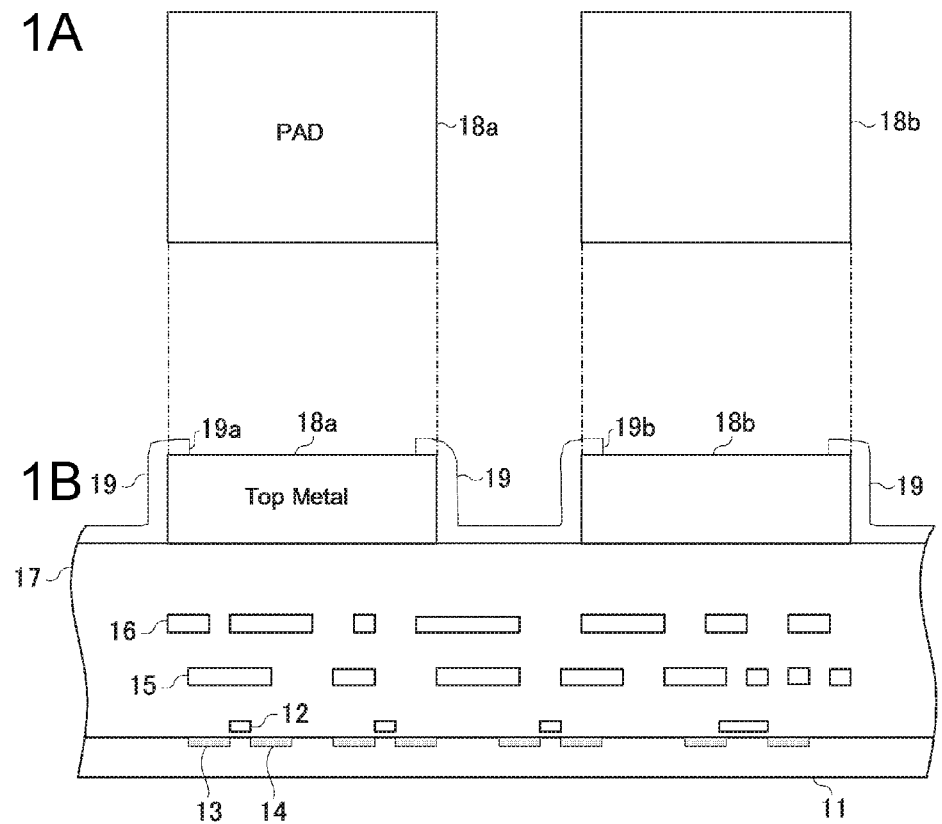

In FIG. 1, (B) is a cross-sectional view showing a semiconductor apparatus according to an embodiment of the invention, and (A) is a plan view of pads shown in (B) in FIG. 1. It should be noted that boundaries between a gate insulation layer and a plurality of interlayer insulation layers formed on a silicon substrate 11 are not shown in (B) in FIG. 1.

Figure 2:
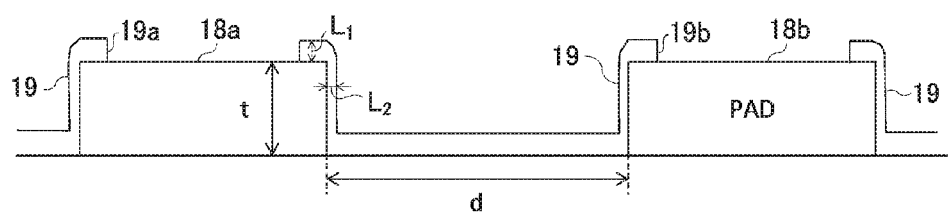
FIG. 2 is a cross-sectional view illustrating dimensions of the pads and a passivation film shown in FIG. 1.

FIG. 2 is a cross-sectional view for illustrating dimensions of the pads and a passivation film (also referred to as "second insulation layer") 19 shown in FIG. 1.

In FIG. 3, (B) is a cross-sectional view showing the semiconductor apparatus after bonding wires 20a and 20b have been respectively joined to pads 18a and 18b shown in (B) in FIG. 1, and (A) is a plan view of the pads shown in (B) in FIG. 3.

Elements are formed on the silicon substrate 11 serving as the semiconductor substrate. Specifically, a gate insulation layer is formed on the silicon substrate 11, and gate electrodes 12 are formed on the gate insulation layer. Ion implantation of impurities into the silicon substrate 11 is performed with the gate electrodes 12 acting as a mask, and then heat processing is performed, thus forming a source diffusion layer 13 and a drain diffusion layer 14 on the silicon substrate 11. As a result, MOS transistors are arranged on the silicon substrate 11.

Next, a first interlayer insulation layer is formed on the gate electrodes 12 and the silicon substrate 11, and a first wiring layer 15 is formed on the first interlayer insulation layer. Then, a second interlayer insulation layer is formed on the first wiring layer 15 and the first interlayer insulation layer, and a second wiring layer 16 is formed on the second interlayer insulation layer. Next, a third interlayer insulation layer 17 (also referred to as "first insulation layer") is formed on the second wiring layer 16 and the second interlayer insulation layer.

Then, a metal layer made of Al or an Al alloy is formed on the third interlayer insulation layer 17, and then patterning is performed on this metal layer, thus forming the first pad 18a and the second pad 18b made of the metal layer on the third interlayer insulation layer 17. The first pad 18a and the second pad 18b are each located above an element.

Next, a passivation film 19 is formed on the first pad 18a, the second pad 18b, and the third interlayer insulation layer 17. The passivation film 19 is formed so as to cover the side surfaces and upper surfaces of the first pad 18a and the second pad 18b. The passivation film 19 may be a single layer or a lamination of a plurality of layers; for example, the passivation film 19 may be a single silicon nitride layer or a single silicon oxide layer, or a laminate of a silicon oxide layer and a silicon nitride layer.

Then, by etching the passivation film 19, an opening 19a located at the upper surface of the first pad 18a and an opening 19b located at the upper surface of the second pad 18b are formed in the passivation film 19. In this way, the passivation film 19 is arranged on the third interlayer insulation layer 17, on the side surfaces and the upper surface of the first pad 18a, and on the side surfaces and the upper surface of the second pad 18b. Note that, in this application, "on a surface" denotes the direction of separation from the pad out of the two directions that are perpendicular to the surfaces of the first pad 18a and the second pad 18b.

As shown in FIG. 2, a thickness t of the first pad 18a and the second pad 18b may be 2 μm or more (preferably 3 μm or more). Also, thicknesses $L_1$ and $L_2$ of the passivation film 19 may be less than or equal to ⅔ of the thickness t of the first pad 18a and the second pad 18b. Furthermore, it a distance d between the first pad 18a and the second pad 18b may be greater than or equal to four times the thickness t of the first pad 18*a* and the second pad 18*b*. Also, the thickness $L_2$ of the passivation film 19 located on respective side surfaces of the first pad 18*a* and the second pad 18*b* may be less than or equal to ⅘ of the thickness $L_1$ of the passivation film 19 located on the respective upper surfaces of the first pad 18*a* and the second pad 18*b*.

Next, as shown in (A) and (B) in FIG. 3, the bonding wires 20*a* and 20*b* are respectively joined to the first pad 18*a* and the second pad 18*b*. At this time, pressure is applied to the first pad 18*a* and the second pad 18*b*. Accordingly, a depression 22 is formed in the respective upper surfaces of the first pad 18*a* and the second pad 18*b*, and projections 21 are formed on the side surfaces of the first pad 18*a* and the second pad 18*b*.

Figures 4A, 4B:
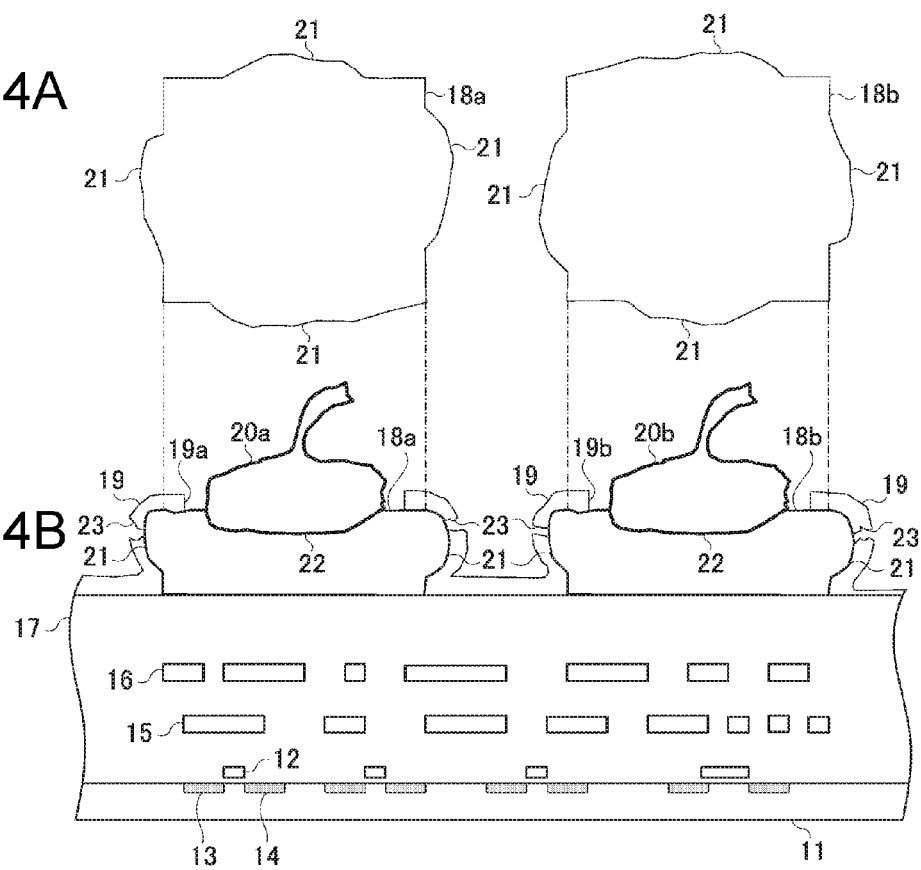
In FIG. 4, (A) is a plan view showing pads to which bonding wires have been joined, and (B) is a cross-sectional view showing another example of a semiconductor apparatus after bonding wires have been joined to the pads.

In FIG. 4, (B) is a cross-sectional view showing another example of a semiconductor apparatus after the bonding wires 20*a* and 20*b* have been joined to the pads shown in (B) in FIG. 1, and (A) is a plan view of the pads shown in (B) in FIG. 4.

As shown in FIG. 4, when the depression 22 is formed in the respective upper surfaces of the first pad 18*a* and the second pad 18*b* and the projections 21 are formed on the side surfaces of the first pad 18*a* and the second pad 18*b*, the pressure applied to the first pad 18*a* and the second pad 18*b* is increased, and the protrusion width of the projections 21 is increased and cracks or split portions 23 are formed in the passivation film 19.

According to the present embodiment, the thickness t of the first pad 18*a* and the second pad 18*b* is made to be 2 μm or more. Accordingly, when the bonding wires 20*a* and 20*b* are respectively joined to the first pad 18*a* and the second pad 18*b*, an impact can be absorbed by the depressions 22 and the projections 21 being formed on the first pad 18*a* and the second pad 18*b*. Thus, even if stress is applied to the first pad 18*a* and the second pad 18*b*, the stress can be absorbed by the first pad 18*a* and the second pad 18*b*. As a result, elements directly under the first pad 18*a* and the second pad 18*b* can be prevented from breaking. Accordingly, a highly reliable semiconductor apparatus can be manufactured.

Also, in the present embodiment, the thicknesses $L_1$ and $L_2$ of the passivation film 19 are made to be less than or equal to ⅖ of the thickness t of the first pad 18*a* and the second pad 18*b*. Accordingly, when the bonding wires 20*a* and 20*b* are respectively joined to the first pad 18*a* and the second pad 18*b*, the depressions 22 and the projections 21 are formed on the first pad 18*a* and the second pad 18*b*. The split portions 23 or the like in the passivation film 19 are more likely to be formed by the projections 21. Accordingly, a strong impact can be absorbed. Thus, even if stress is applied to the first pad 18*a* and the second pad 18*b*, the stress can be absorbed by the split portions 23 or the like being formed in the passivation film 19. As a result, the elements directly below the first pad 18*a* and the second pad 18*b* can be prevented from breaking. By making the distance d between the first pad 18*a* and the second pad 18*b* to be greater than or equal to four times the thickness t of the first pad 18*a* and the second pad 18*b*, cracks or the split portions 23 are formed in the passivation film 19, and short circuiting of the first pad 18*a* and the second pad 18*b* can be prevented, even if the gap between the projection 21 of the first pad 18*a* and the projection 21 of the second pad 18*b* is reduced.

Also, the thickness $L_2$ of the passivation film 19 located on the side surfaces of the first pad 18*a* and the second pad 18*b* is made to be less than or equal to ⅘ of the thickness $L_1$ of the passivation film 19 located on the upper surfaces of the first pad 18*a* and the second pad 18*b*. Accordingly, when the bonding wires 20*a* and 20*b* are respectively joined to the first pad 18*a* and the second pad 18*b*, the depression 22 and the projections 21 are formed on the first pad 18*a* and the like. Piercing of the passivation film 19 by the projections 21 allows for the split portions 23 and the like to form easily. Thus, a strong impact can be absorbed. Accordingly, even if stress is applied to the first pad 18*a* and the second pad 18*b*, the stress can be absorbed by the split portions 23 and the like being formed in the passivation film 19. As a result, the elements directly below the first pad 18*a* and the second pad 18*b* can be prevented from breaking.

Note that in the present embodiment, as shown in FIGS. 3 and 4, the bonding wires 20*a* and 20*b* are respectively joined to the first pad 18*a* and the second pad 18*b*, but the following changes can also be implemented.

A first bump (not shown) is formed on the first pad 18*a* exposed by the opening 19*a*, and a second bump (not shown) is formed on the second pad 18*b* exposed by the opening 19*b*. Then, the semiconductor apparatus is mounted to the mounting substrate (not shown) by joining the first bump to a first electrode on the mounting substrate and joining the second bump to a second electrode on the mounting substrate. At this time, pressure is applied to the first pad 18*a* and the second pad 18*b*. Accordingly, the projections 21 are formed on the side surfaces of the first pad 18*a* and the second pad 18*b*.

As described above, when the projections 21 are formed on the side surfaces of the first pad 18*a* and the second pad 18*b*, the pressure applied to the first pad 18*a* and the second pad 18*b* is increased, and the protrusion width of the projections 21 is increased to form cracks or the split portions 23 in the passivation film 19.

The same effects as those of the present embodiment can be obtained with the above-described variation.

Also, besides the above-described variation, there are cases where stress is applied to the first pad 18*a* and the second pad 18*b* when a probe needle comes into contact with the first pad 18*a* and the second pad 18*b* for inspection in an inspection step. Even in this case, the stress can be absorbed by the first pad 18*a* and the second pad 18*b*, and the stress can be absorbed by the split portions 23 and the like being formed in the passivation film 19. As a result, the elements directly below the first pad 18*a* and the second pad 18*b* can be prevented from breaking. Accordingly, a highly reliable semiconductor apparatus can be manufactured.

Also, in the present embodiment, as shown in FIG. 1, the planar shape of the first pad 18*a* and the second pad 18*b* is a square shape, but the shapes thereof can be changed to other shapes and implemented.

Figure 5A:
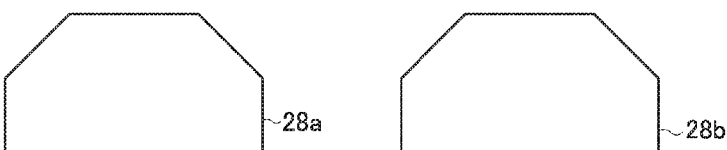
In FIG. 5, (A) is a plan view showing pads of a semiconductor apparatus according to a variation of FIG. 1, and (B) is a cross-sectional view of the semiconductor apparatus according to the variation of FIG. 1.
Figure 5B:
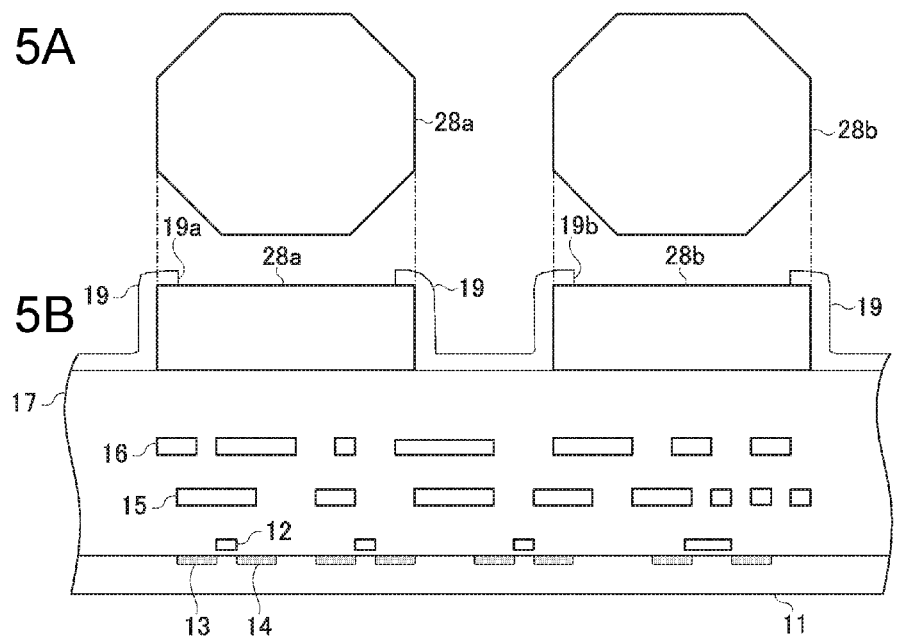

The planar shape of the first pad 18*a* and the second pad 18*b* may be changed to a polygonal shape other than a square shape, and as shown in FIG. 5, the planar shape of a first pad 28*a* and a second pad 28*b* may be changed to an octagon.

Figure 6A:
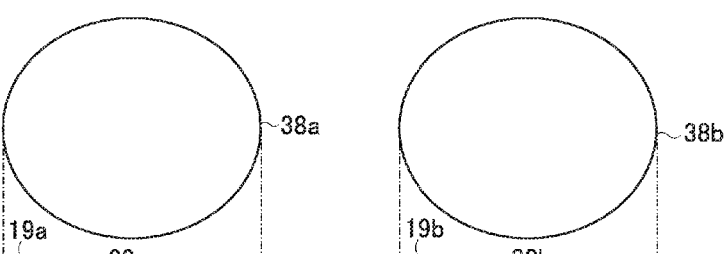
In FIG. 6, (A) is a plan view showing pads of a semiconductor apparatus according to a variation of FIG. 1, and (B) is a cross-sectional view of the semiconductor apparatus according to the variation of FIG. 1.
Figure 6B:
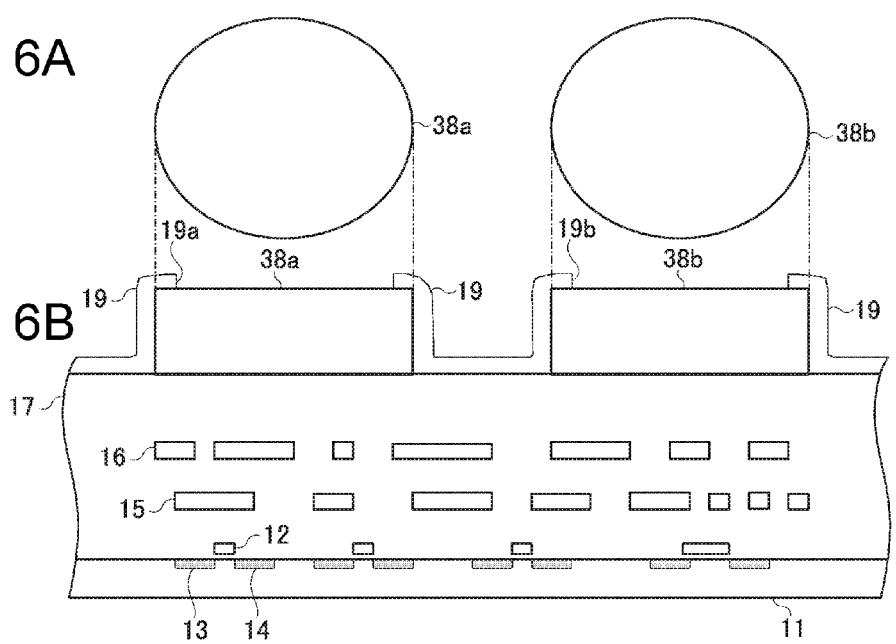

Also, as shown in FIG. 6, the planar shape of a first pad 38*a* and a second pad 38*b* may be changed to a circular shape. Accordingly, impact when joining the bonding wires, at the time of mounting, in the inspection step, or the like, can be absorbed by the first pad 38*a* and the second pad 38*b* in an isotropic manner. The planar shape of the first pad 18*a* and the second pad 18*b* may be elliptical or fan-shaped.

Also, an aspect of the invention may be an electronic device including any of the semiconductor apparatuses shown in FIGS. 1 and 3 to 6.

The above-described electronic device may correspond to, for example, mobile terminals such as mobile phones, smart cards, calculators, electronic dictionaries, electronic gaming devices, digital still cameras, digital video cameras, televisions, television phones, security television monitors, head-mount displays, personal computers, printers, network devices, car navigation apparatuses, measuring devices, medical devices (for example, electronic thermometers, sphygmomananometers, blood glucose measurers, electrocardiographic apparatuses, ultrasonic diagnostic equipment, and electronic endoscopes), and the like.

Also, an aspect of the invention may be a moving body including any of the semiconductor apparatuses shown in FIGS. 1 and 3 to 6.

The aforementioned moving body may correspond to, for example, automobiles, self-propelling robots, self-propelling transport equipment, trains, marine vessels, airplanes, satellites, or the like.

Note that, in an aspect of the invention, forming a specific component B (hereinafter "B") (B is formed) on (or under) a specific component A (hereinafter "A"), is not limited to cases of forming B (B is formed) directly on (or under) A. Cases of forming B (B being formed) on (or under) A via another component without impeding the effects of the invention may also be included therein.

Also, a direction designated by on (or under) for describing a configuration is not necessarily limited to one direction. For example, cases of forming B (B being formed) on (or under) A include cases of forming B (B being formed) under (or on) A, when a semiconductor device is used in a vertically inverted orientation.

The entire disclosure of Japanese Patent Application No. 2015-163100, filed Aug. 20, 2015 is expressly incorporated by reference herein.

What is claimed is:

1. A semiconductor apparatus comprising:
    a substrate;
    an element arranged on the substrate;
    a first insulation layer arranged on the element and the substrate;
    a first pad arranged on the first insulation layer and located above the element;
    a second pad arranged on the first insulation layer; and
    a second insulation layer arranged on the first insulation layer, on a side surface and an upper surface of the first pad, and on a side surface and an upper surface of the second pad, wherein
    the second insulation layer includes an opening located at the upper surface of the first pad and an opening located at the upper surface of the second pad,
    the first pad and the second pad each have a thickness of 2 µm or more,
    the second insulation layer has a thickness that is less than or equal to $2/5$ of the thickness of the first pad and the second pad,
    a distance between the first pad and the second pad is greater than or equal to four times the thickness of the first pad and the second pad,
    bonding wires or bumps are respectively joined to the first pad and the second pad,
    the first pad has a projection on a side surface thereof, and
    the second pad has a projection on a side surface thereof.

2. The semiconductor apparatus according to claim 1, wherein portions of the second insulation layer located on the side surfaces of the first pad and the second pad have a crack or a split portion.

3. The semiconductor apparatus according to claim 1, wherein a planar shape of the first pad and the second pad is a polygonal shape or a circular shape.

4. The semiconductor apparatus according to claim 1, wherein a material of the first pad and the second pad is Al or an Al alloy.

5. A semiconductor apparatus comprising:
    a substrate;
    an element arranged on the substrate;
    a first insulation layer arranged on the element and the substrate;
    a first pad arranged on the first insulation layer and located above the element;
    a second pad arranged on the first insulation layer; and
    a second insulation layer arranged on the first insulation layer, on a side surface and an upper surface of the first pad, and on a side surface and an upper surface of the second pad, wherein
    the second insulation layer includes an opening located at the upper surface of the first pad and an opening located at the upper surface of the second pad,
    the first pad and the second pad each have a thickness of 2 µm or more,
    the second insulation layer has a thickness that is less than or equal to $2/5$ of the thickness of the first pad and the second pad,
    a distance between the first pad and the second pad is greater than of equal to four times the thickness of the first pad and the second pad, and
    a thickness of portions of the second insulation layer located on the side surfaces of the first pad and the second pad is less than or equal to $4/5$ of a thickness of portions of the second insulation layer located on the upper surfaces of the first pad and the second pad.

6. An electronic device comprising the semiconductor apparatus according to claim 1.

7. A moving body comprising the semiconductor apparatus according to claim 1.

8. A method for manufacturing a semiconductor apparatus, comprising:
    (a) forming an element on a substrate;
    (b) forming a first insulation layer on the element and the substrate;
    (c) forming a first pad on the first insulation layer so as to be located above the element, and forming a second pad on the first insulation layer;
    (d) forming a second insulation layer on the first insulation layer, the first pad, and the second pad;
    (e) forming an opening at an upper surface of the first pad and at an upper surface of the second pad, wherein
        in the step (c), the first pad and the second pad are each formed so as to have a thickness of 2 µm or more, and such that a distance between the first pad and the second pad is greater than or equal to four times the thickness of the first pad and the second pad, and
        in the step (d), the second insulation layer is formed so as to have a thickness that is less than or equal to $2/5$ of the thickness of the first pad and the second pad; and
    after the step (e), (f) forming a depression in the upper surfaces of the first pad and the second pad and forming a projection on side surfaces of the first pad and the second pad by joining bonding wires to the first pad and the second pad respectively.

9. A method for manufacturing a semiconductor apparatus, comprising:
    (a) forming an element on a substrate;
    (b) forming a first insulation layer on the element and the substrate;

(c) forming a first pad on the first insulation layer so as to be located above the element, and forming a second pad on the first insulation layer;

(d) forming a second insulation layer on the first insulation layer, the first pad, and the second pad;

(e) forming an opening at an upper surface of the first pad and at an upper surface of the second pad, wherein in the step (c), the first pad and the second pad are each formed so as to have a thickness of 2 µm or more, and such that a distance between the first pad and the second pad is greater than or equal to four times the thickness of the first pad and the second pad, and in the step (d), the second insulation layer is formed so as to have a thickness that is less than or equal to $\frac{2}{5}$ of the thickness of the first pad and the second pad; and after the step (e), (f) forming a first bump on the first pad and forming a second bump on the second pad, and (g) mounting a semiconductor apparatus on a mounting substrate by joining the first bump to a first electrode on the mounting substrate and joining the second bump to a second electrode on the mounting substrate, wherein, in the step (g), when the semiconductor apparatus is mounted to the mounting substrate, a depression is formed in the upper surfaces of the first pad and the second pad, and a projection is formed on side surfaces of the first pad and the second pad.

10. The method for manufacturing a semiconductor apparatus according to claim 8, wherein, when the projection is formed on the side surfaces of the first pad and the second pad, a crack or a split portion is formed in portions of the second insulation layer located on the side surfaces of the first pad and the second pad.

11. The semiconductor apparatus according to claim 1, wherein a thickness of portions of the second insulation layer located on the side surfaces of the first pad and the second pad is less than or equal to $\frac{4}{5}$ of a thickness of portions of the second insulation layer located on the upper surfaces of the first pad and the second pad.

12. The semiconductor apparatus according to claim 2, wherein a thickness of portions of the second insulation layer located on the side surfaces of the first pad and the second pad is less than or equal to $\frac{4}{5}$ of a thickness of portions of the second insulation layer located on the upper surfaces of the first pad and the second pad.

13. The method for manufacturing a semiconductor apparatus according to claim 9, wherein, when the projection is formed on the side surfaces of the first pad and the second pad, a crack or a split portion is formed in portions of the second insulation layer located on the side surfaces of the first pad and the second pad.

\* \* \* \* \*